United States Patent
Shih et al.

(10) Patent No.: US 9,128,387 B2
(45) Date of Patent: Sep. 8, 2015

(54) ULTRAVIOLET LIGHT EMITTING DIODE ARRAY LIGHT SOURCE FOR PHOTOLITHOGRAPHY AND METHOD

(71) Applicant: Taiwan Semiconductor Manufacturing Co., Ltd., Hsin-Chu (TW)

(72) Inventors: Jaw-Lih Shih, Jhudong Township (TW); Hong-Hsing Chou, Jhubei (TW); Yeh-Chieh Wang, Hsinchu (TW); Hsin-Kuo Chang, Hsinchu (TW); Chung-Nan Chen, Zhubei (TW); Kuang Hsiung Cheng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 124 days.

(21) Appl. No.: 13/893,368

(22) Filed: May 14, 2013

(65) Prior Publication Data

US 2014/0340665 A1    Nov. 20, 2014

(51) Int. Cl.
*G03F 7/20* (2006.01)
*G02B 26/06* (2006.01)

(52) U.S. Cl.
CPC .......... *G03F 7/70191* (2013.01); *G03F 7/7005* (2013.01); *G03F 7/70583* (2013.01); *G03F 7/70891* (2013.01); *G02B 26/06* (2013.01)

(58) Field of Classification Search
CPC .............. G03F 7/70075; G03F 7/7005; G03F 7/70091; G03F 7/70191; G02B 19/0052; G02B 26/06
USPC ........................ 355/67, 71; 250/494.1, 504 R; 362/249.02, 249.03, 800
See application file for complete search history.

(56) References Cited

U.S. PATENT DOCUMENTS

| | | | |
|---|---|---|---|
| 6,233,039 B1 * | 5/2001 | Yen et al. | 355/53 |
| 7,692,733 B2 | 4/2010 | Daiku | |
| 8,330,938 B2 * | 12/2012 | Malach et al. | 355/70 |
| 2008/0111983 A1 * | 5/2008 | Singer et al. | 355/69 |
| 2008/0284999 A1 * | 11/2008 | Thallner | 355/53 |
| 2009/0002669 A1 * | 1/2009 | Liu et al. | 355/67 |
| 2009/0168035 A1 * | 7/2009 | Kim et al. | 355/53 |
| 2010/0032585 A1 | 2/2010 | Caiger et al. | |
| 2010/0045954 A1 * | 2/2010 | Onvlee et al. | 355/67 |
| 2010/0283978 A1 | 11/2010 | Hawryluk | |
| 2010/0301764 A1 * | 12/2010 | Liu | 315/250 |
| 2011/0294074 A1 * | 12/2011 | Lee et al. | 430/322 |
| 2012/0039543 A1 | 2/2012 | Krishnamurthy et al. | |
| 2012/0264066 A1 * | 10/2012 | Chen et al. | 430/322 |
| 2013/0342825 A1 * | 12/2013 | Chimmalgi et al. | 356/51 |

* cited by examiner

*Primary Examiner* — Steven H Whitesell Gordon
(74) *Attorney, Agent, or Firm* — Duane Morris LLP (57) ABSTRACT

A light source includes a plurality of ultraviolet (UV) light emitting diodes (LEDs) and an LED phase shift controller coupled to the plurality of UV LEDs adapted to control the phase shift of each UV LED in the plurality of UV LEDs. The plurality of UV LEDs forms a UV LED array. An ultraviolet lithography system can include a light source as described above. The system can further include a mirror assembly in a light path of the light source, the mirror assembly having a polarization mirror with an interference coating. A method provides a light source for an ultraviolet lithography system including the element of providing an plurality of UV LEDs that emit UV light and the element of controlling a phase shift of the plurality of UV LEDs with an LED phase shift controller coupled to each UV LED or arrays of the UV LEDs in the plurality of UV LEDs.

20 Claims, 8 Drawing Sheets

ULTRAVIOLET LIGHT EMITTING DIODE ARRAY LIGHT SOURCE FOR PHOTOLITHOGRAPHY AND METHOD

TECHNICAL FIELD

The disclosure is related to a method and apparatus using ultraviolet (UV) light emitting diode (LED) arrays as light sources for photolithography or other imaging processes.

BACKGROUND

Mercury vapor discharge lamps have been used to generate UV radiation for initiating the curing of UV curable substances such as inks, furniture coatings, patterning of lithography resists, adhesives and three-dimensional modeling materials. However, mercury lamps are inefficient in their use of energy, take time to heat up and cool down and if broken can release mercury which is highly toxic. Accordingly, there is a move away from mercury discharge lamps and toward solid state UV radiation sources such as UV light emitting diodes (LEDs). UV LEDs can be rapidly switched on and off, are more energy efficient than mercury lamps and are safer to use. They are also more compact and can be less expensive than mercury lamps. The UV LEDs are generally used in the form of an array comprising a large number of individual LED chips. Some applications include an array UV LEDs that is a mixed array comprising LEDs having differing peak wavelengths in the UV region, thereby providing UV radiation having more than one peak wavelength.

The word "array" as used herein refers broadly to any collection of solid state radiation sources. The solid state radiation sources may be light emitting diodes, laser diodes, vertical cavity surface emitting lasers, polymer light emitting diodes (LEDs), electroluminescent devices, and any other suitable device which generates electromagnetic radiation via the recombination of holes and electrons. The array may comprise a mixture of different categories of solid state radiation source.

An array may include a collection of individual LEDs arranged, for example, in a rectangular pattern. The array may comprise a dense array of LED chips on a common substrate. For example, the array may include more than 10, optionally more than 50 solid state UV radiation sources. The array may comprise LEDs with specific wavelength, for example: 365 nm (I_line), 436 nm (G_line), 405 nm (H_line) or at least two types of solid state UV radiation sources having different peak wavelengths such that the UV radiation emitted by the module has more than one peak wavelength.

BRIEF DESCRIPTION OF THE DRAWINGS

There are shown in the drawings certain exemplary embodiments intended to illustrate aspects of the subject matter disclosed. The subject developments are not limited to the embodiments illustrated as examples, and reference should be made to the claims to assess the scope of the subject matter. In the drawings.

DETAILED DESCRIPTION

Figure 1:
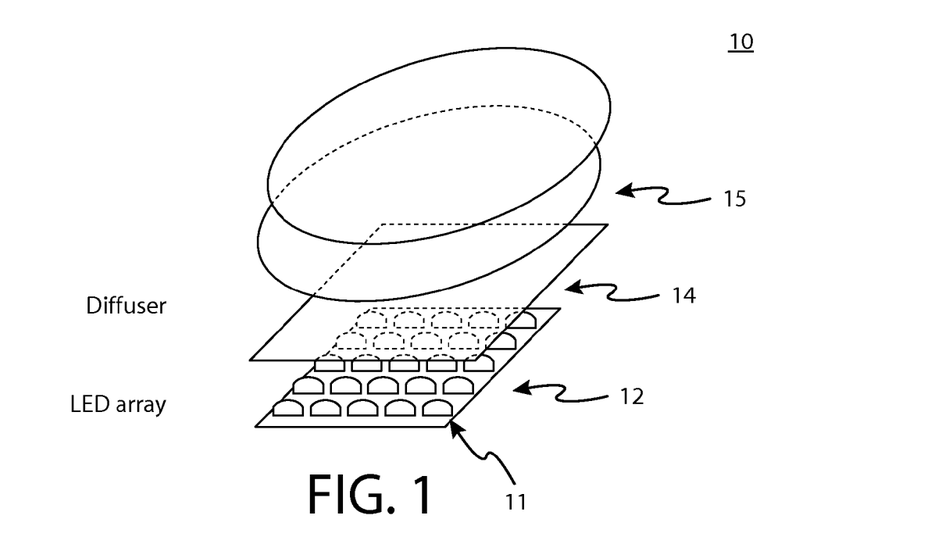
FIG. 1 is a perspective view of a LED light source arrangement in accordance with an example of the embodiments.
Figure 2:
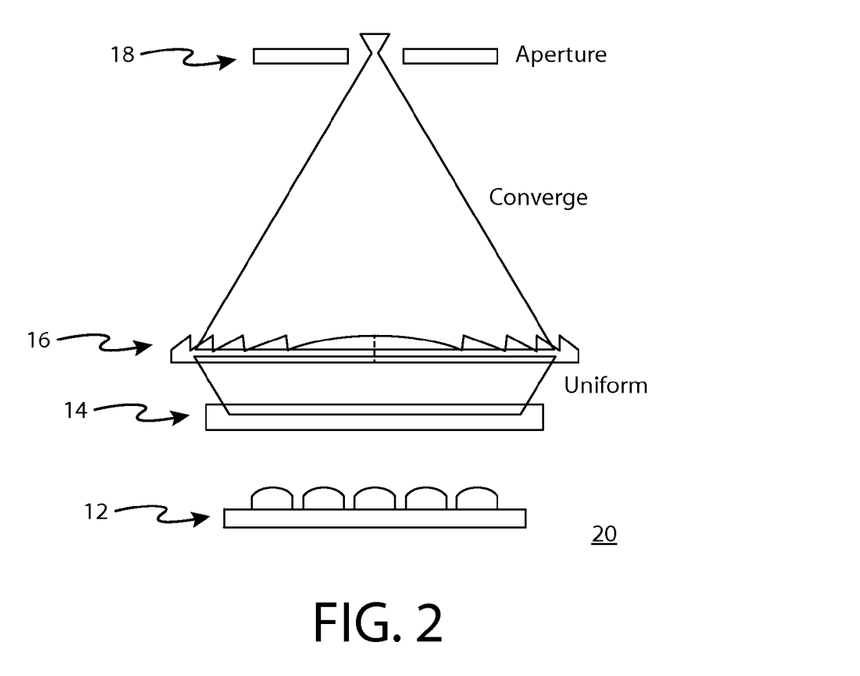
FIG. 2 is a side view of another LED light source arrangement in accordance with another example of the embodiments.

FIG. 1 is a simplified perspective view of an LED light source arrangement 10 including a plurality or array 12 of LEDs 11. The LED light source arrangement 10 can include a diffuser 14 or light homogenizer in a light path above the array 12 and a convex lens 15 in the light path above the diffuser 14 as shown. In an alternative embodiment as shown in FIG. 2, a side view of an LED light source arrangement 20 comprises the array 12 of LEDs, the diffuser 14, and a Fresnel lens 16. The Fresnel lens 16 is used to converge the light towards the aperture 18 as shown.

The UV LED array or a combination of arrays and subsidiary lens modules can be used as stepper and scanner exposure light source for a photolithography system and replace ultra high pressure mercury-vapor (Hg) lamps that are popularly used in stepper and scanner of photolithography to expose various photoresists. The unique spectral emission characteristics of mercury vapor lamps are ideal for photoresists. A mercury-vapor lamp is a gas discharge lamp that uses an electric arc through vaporized mercury to produce light, and its strongest peaks of the emission line spectrum are generally photosensitive at 365 nm (I_line), 405 nm (H_line) and 436 nm (G_line) wavelengths.

Clear mercury (Hg) lamps produce white light with a bluish-green tint due to mercury's combination of spectral lines, but Hg lamp light emissions are not pure I/H/G line only. The light shifts into the visible range and the high gas pressure also causes the mercury emission bands to broaden somewhat. For the photolithography process, extra lenses or filters such as an ellipsoidal mirror, WG filter, UV filter and interference filter are used to filter out the I_line or H_line_or G_line wavelength for photosensitive processes. More lenses or filters in the optical path may cause more light intensity decay. Further note that mercury in a tube is a liquid at normal temperatures and is vaporized and ionized before the tube will conduct electricity and the arc can start. Thus a mercury lamp will have a warm-up time of approximately 7 to 10 minutes and further uses a starter and ballast to start the lamp. Thus, a mercury lamp has high power consumption (in thousands of Watts) for light emitting not to mention the toxicity and environmental hazards of mercury.

LED based lights sources can simplify the whole framework design of UV (I_line/G_line/H_line) stepper/scanner illumination systems since LED-based lighting sources have high luminous efficiency with approximately 60% saving in power consumption. LED-based light sources also have 5 to 20 times the lifespan of mercury lamps which typically have a maximum life of 25000 hours. Furthermore, LED lights sources generally have easier maintenance and are considered more environmentally friendly without mercury disposal concerns. Note that mercury lamps usually require a number of filters to remove unwanted spectral content.

Figure 3:
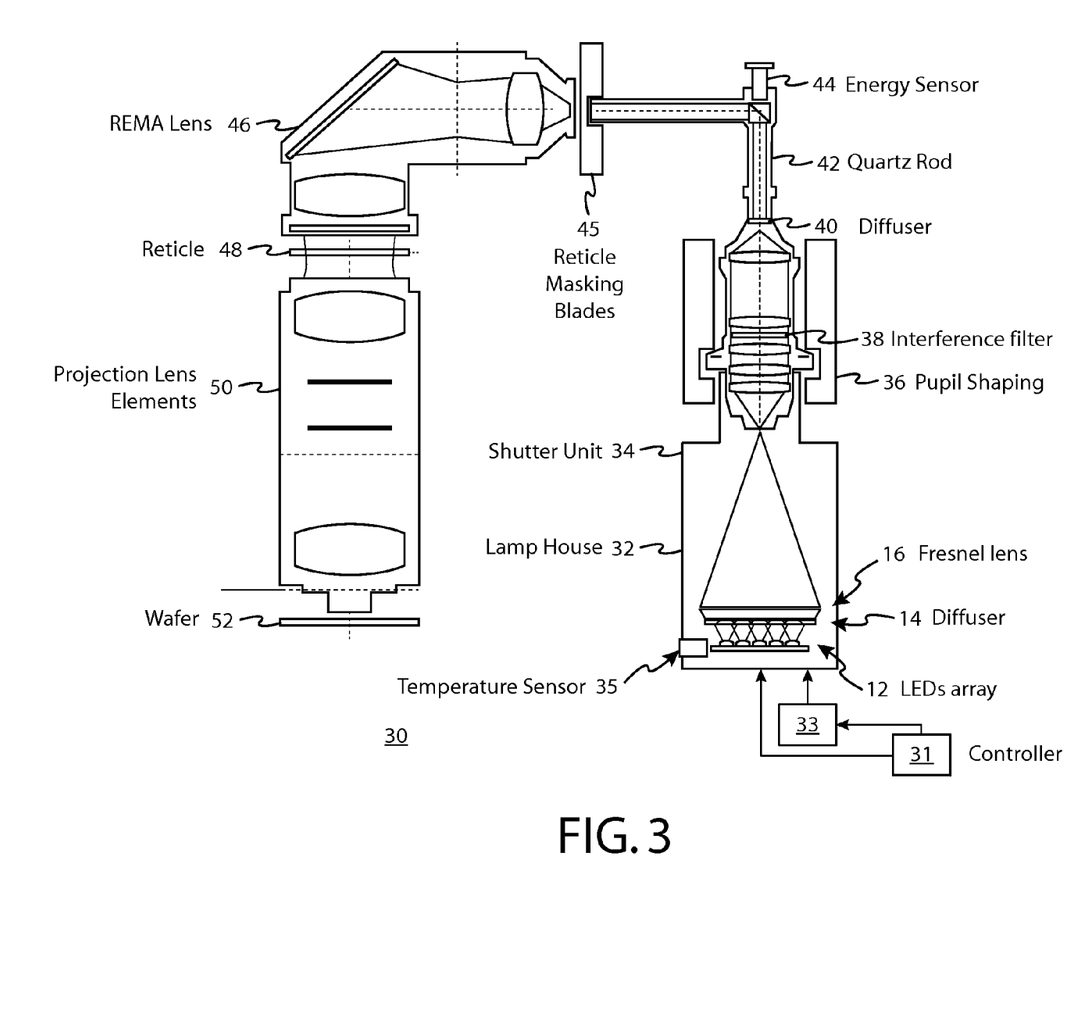
FIG. 3 is side view of a UV LED illumination system used for lithography in accordance with an embodiment.

However, LED-based light sources still have other unforeseen issues that can benefit with further control in terms of temperature and phase shift among other factors. Referring to FIG. 3, a UV LED-based lithography illumination system 30 can include the LED array 12, diffuser 14 (or other optical filters to optimize the LED light uniformity), Fresnel lens 16 (or customized convex lens for light focusing), and shutter unit 34 within a lamp housing 32. The lamp housing 32 can form a part of a heat sink module (see FIG. 10) for controlling LED operational temperature. The temperature can be further controlled with a temperature controller 35 that can include a temperature sensor. The temperature sensor module 35 can be installed to control active cooling devices such as a gas purging system and a water cooling system. The system 30 can further include an independent power supply and power controller 33. An appropriate heat sink design, both active and passive, and controller can keep the whole LED module working at an idea operational temperature (such as 25 degrees Celsius) for optimizing the light output and maximizing LED device lifetime. Note, in comparison to a mercury lamp, an ellipsoidal mirror, a UV filter, an interference filter and other filters on a backend of the light path of the system 30 can be removed to minimize the loss of light transmission.

The system 30 can further include a controller that can include an LED phase shift controller 31 that ensures that the LED light array (12) or a combination of arrays remains in-phase without optical interference and provide better critical dimension (CD) uniformity at the wafer level. One phase shift controller can control one or multiple light sources. The system 30 can further include a pupil shaping module 36 including an interference filter 38, a second diffuser 40, a quartz rod 42, an energy sensor 44, reticle masking blades 45, a reticle mask (REMA) lens 46, a reticle 48, and a projection lens module 50 that projects an image upon a targeted wafer 52. Other configurations can be made using any number of optional relay lenses that direct light through the patterned mask at a reticle plane. Eventually a patterned illumination is directed through an objective lens to an image plane on the surface of a photosensitive substrate such as the wafer 52. The controller that includes the LED phase shift controller 31 can also be adapted to control motor devices that enable the individual UV LEDs or one or more arrays of UV LEDs to move in a desired manner as further detailed below. The controller can also operate in conjunction with a temperature sensor and cooling system to server as a temperature controller. Thus, a single controller device can control a number of functions such as phase shift, light direction and placement, and temperature. Other embodiments within the scope of the claims also contemplate having separate controllers for each of the functions described or a number of controllers for functions in various combinations. A single controller is shown for simplicity and not intended to limit the scope of the embodiments.

Figure 11:
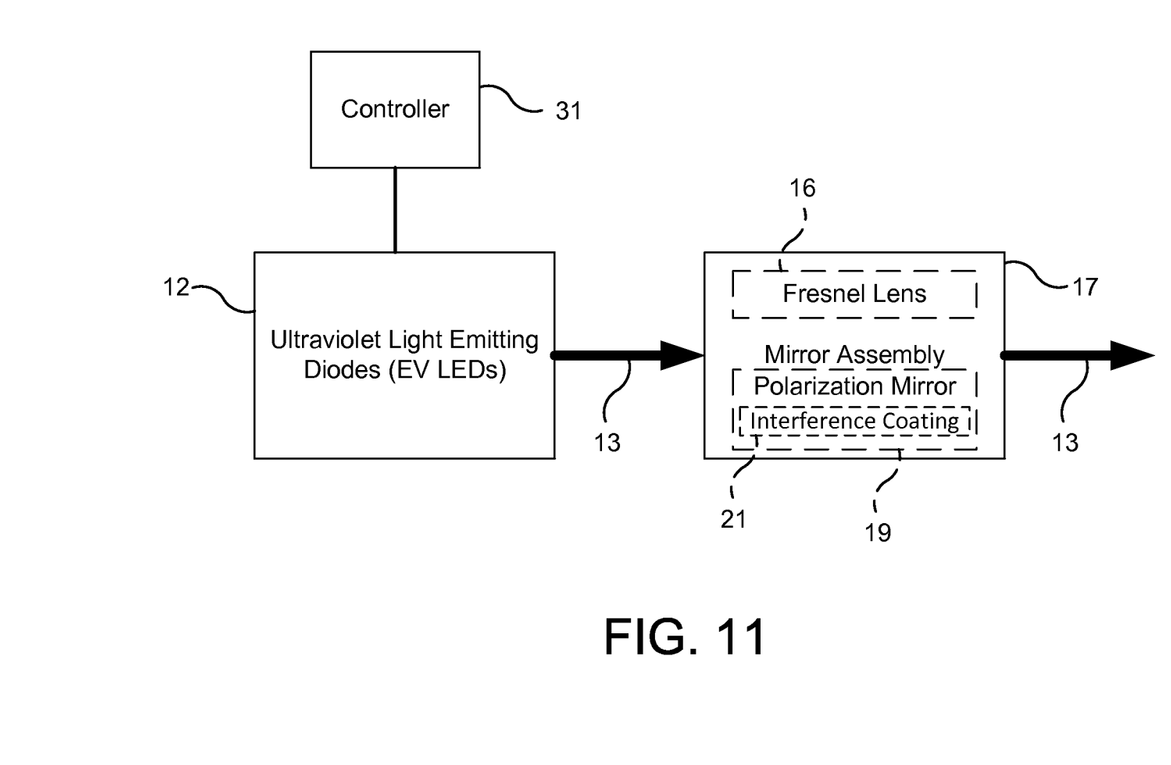
FIG. 11 is a block diagram illustrating one embodiment of a mirror assembly in a light path of a UV LED light source in accordance with an embodiment.

Further note that the LED array 12 can be controlled to move and rotate in an X, Y or Z direction enabling adjustments in height of the light source relative to the optical path and in angles as in tilting. The ability to adjust in such a manner helps to homogenize the UV light and provides for easier focusing and ensure the light uniformity across the aperture 18 within given specifications. The power supply can also be programmable to adjust power output and control the power density at the wafer plane for UV lithography system and can be monitored by energy sensor 30. As shown in FIG. 11, in the mirror assembly 17 or assemblies that can be implemented with the embodiments, a polarization mirror 19 with interference coating 21 can be used for light narrowing and depth of focus increase. As noted above, the Fresnel lens 16 or convex mirrors can be used for light focusing as well. Optionally, the system can include associated cooling units for the LED elements. Such cooling elements can include a gas purging module, a heat sink module and/or a water cooling system to enable efficient heat dissipation. Thus, the embodiments herein can control not only the light intensity and angular placement or tilt of the light, but can further control the phase of the light source or sources. Further control of temperature is also contemplated as explained above. The embodiment of the system 30 can be a scanner used in photolithography, but the concepts embodied therein can be implemented in a stepper device used in photolithography.

Figure 4:
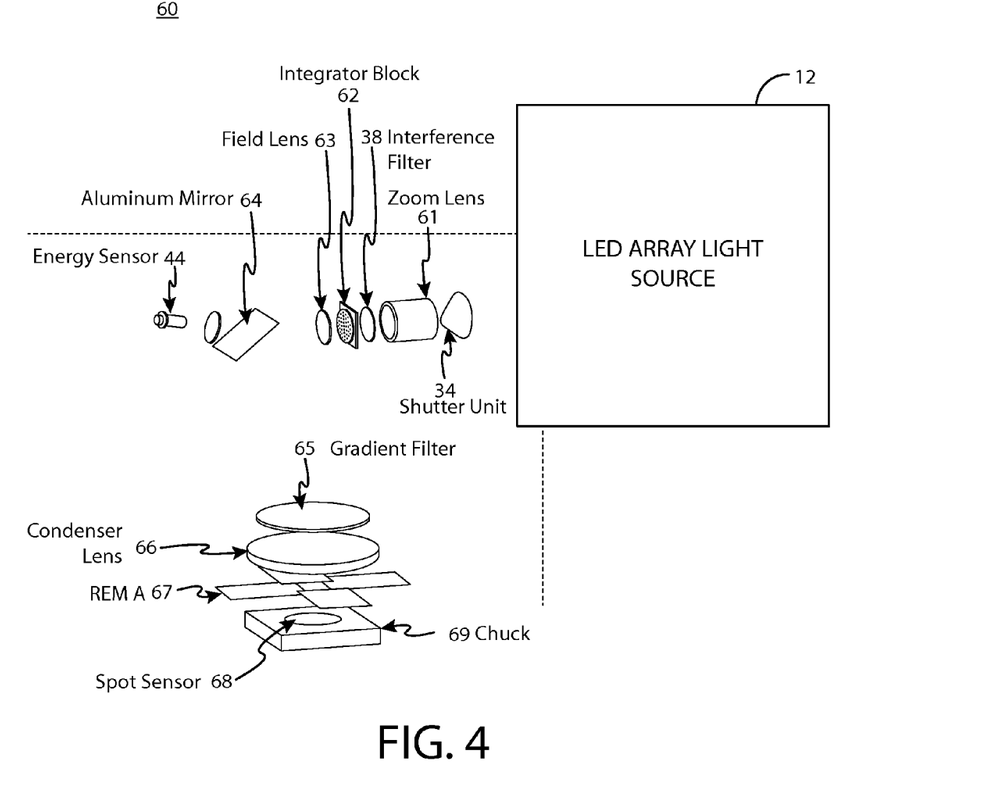
FIG. 4 is an illustration of the components of another UV LED illumination system in accordance with an embodiment.

Referring to FIG. 4, an alternative illumination system 60 illustrates the optical path and components used in stepper device that includes the LED Array light source 12. Some of the same components in other embodiments are also used with this system. The illumination system 60 can include the shutter unit 34, a zoom lens 61, the interference filter 38, an integrator block 62, a field lens 63, an aluminum mirror, and the energy sensor 44. The system 60 can further include a gradient filter 65, a condenser lens 66, a replica molding or REM 67, a spot sensor 68 and a chuck 69.

Figure 5:
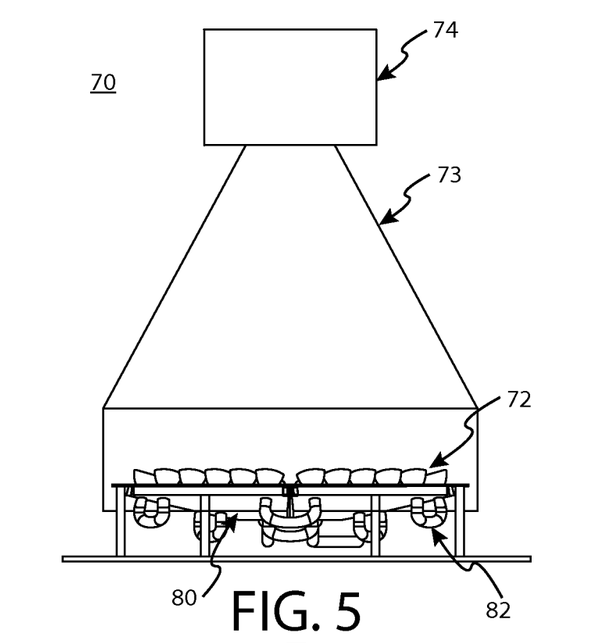
FIG. 5 is a side view of a UV LED light source and heat sink module in accordance with an embodiment.
Figure 6:
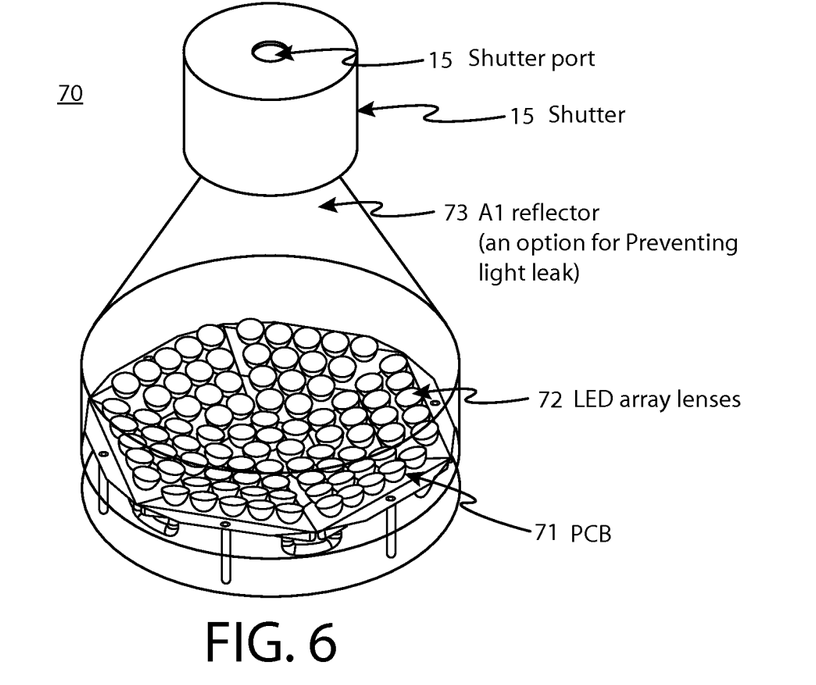
FIG. 6 is a top perspective view of the UV LED light source and heat sink of FIG. 5.
Figure 7:
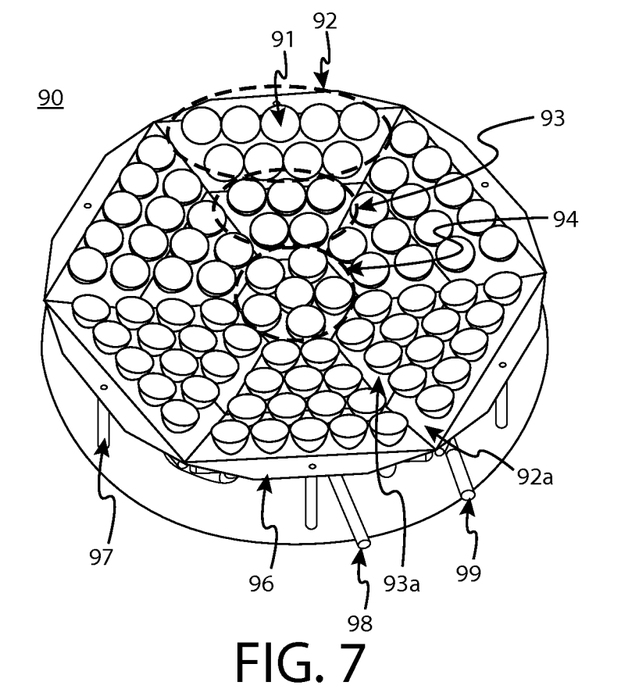
FIG. 7 is a top perspective view of a UV LED light source or array (and heat sink) module in accordance with an embodiment.

Referring to FIGS. 5 and 6, a more detailed view of a lamp housing or assembly 70 having the LED array 72 (or arrays) and cooling system or heat sink module 80 is shown. FIG. 5 shows a side view while FIG. 7 shows a top perspective view. The lamp housing or assembly 70 can further include an optional aluminum reflector 73 to prevent light from leaking outside the light housing or assembly 70. The lamp housing further includes a shutter 74 having a shutter port 75 as shown.

Referring to FIG. 7, a top perspective view of an assembly 90 illustrates a plurality of UV LED lights 91 that can form one or more UV LED light arrays. For example, the assembly 90 can have an array 92 of UV LED lights on a printed circuit board 92a that includes nine (9) UV LEDs. Another array 93 can have five (5) UV LED lights (91) on another printed circuit board 93a. Yet another array 94 can include another five (5) UV LED lights. Each UV LED in the array can be angled or tilted (or raised or lowered) in a particular optical path. For example, the UV LEDs in array 94 can be pointing at a 90 degree angle while the UV LEDs in array 93 can be at a 80 degree angle and the UV LEDs in array 92 can be at a 75 degree angle with respect to an aperture or other focal point. The each array can be manipulated to move in X, Y or Z directions and each individual UV LED within each array can also be similarly manipulated or controlled in certain embodiments. The various printed circuit boards (e.g., 92a, 93a) and the multiple UV LED arrays (e.g., 92, 93, and 94) can all reside on a platform 96. Underneath the platform and attached to the platform 96 is a heat sink module 80 that can primarily be composed of copper as better illustrated in FIG. 8. The platform can be raised off a bottom surface using columns 97. A water inlet 98 and a water outlet 99 of the heat sink module 80 can be seen in FIG. 7.

Figure 8:
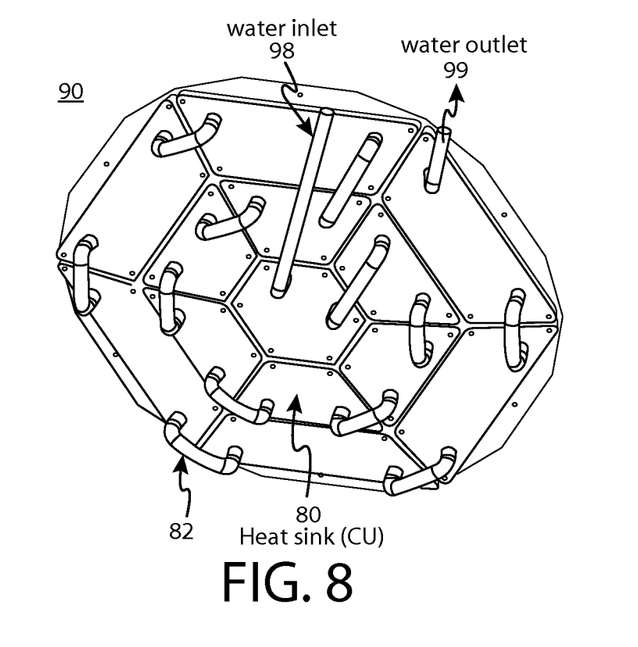
FIG. 8 is a bottom perspective view of the heat sink module of FIG. 7 in accordance with an embodiment.

Referring to FIG. 8, a bottom perspective view of the assembly 90 better illustrates the heat sink module 80 or cooling system that includes the water inlet 98 and water outlet 99. The heat sink module 80 further includes a series of pipes or coils 82 allow for efficient thermal dissipation. The cooling system 80 can include one or more of a purge gas module, a heat sink module and a cooling water system.

Figure 9:
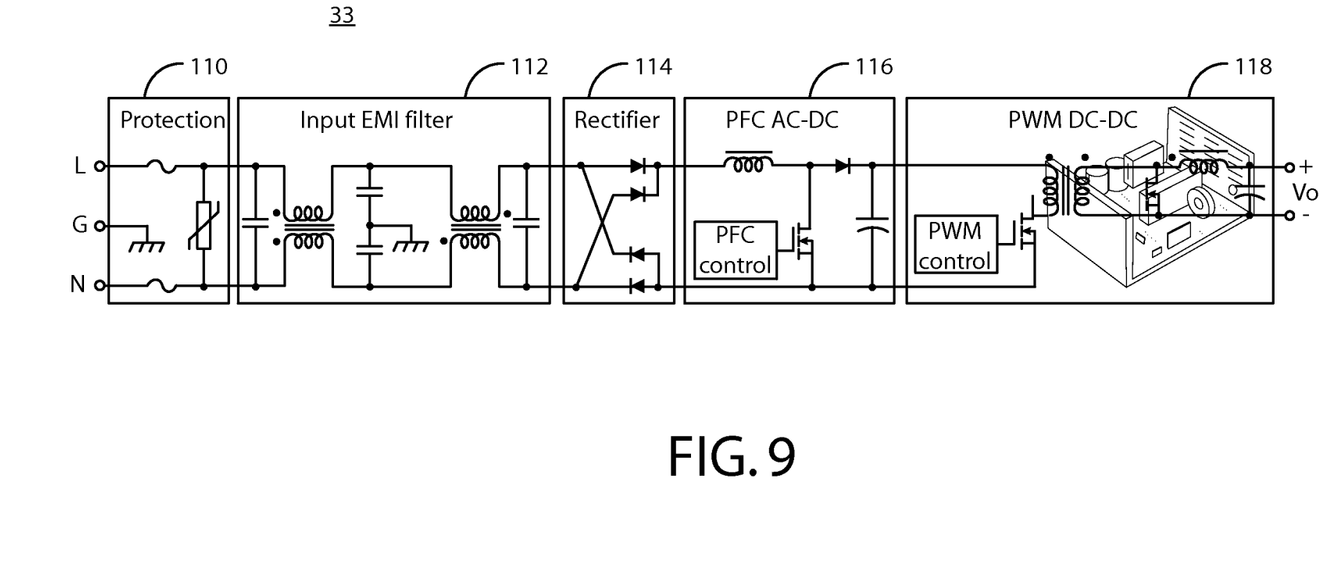
FIG. 9 is a combined circuit and block diagram of a power supply used with a UV LED illumination system in accordance with an embodiment.

Referring to FIG. 9, the power supply 33 previously shown in FIG. 3 is illustrated in further detail. In one embodiment, the power supply 33 includes a protection circuit 110, an input electromagnetic interference (EMI) filter, and a rectifier circuit 114. The power supply 33 can further include control modules such as a power factor control AC-DC converter module 116 to improve the power quality and a pulse width modulation DC-DC converter module 118. In one embodiment, the power supply has an AC input between 90 to 230 volts at 50 to 60 Hertz and an output that is a DC forward voltage between approximately 40 and 48 volts. The output current is approximately 2 amps.

Figure 10:
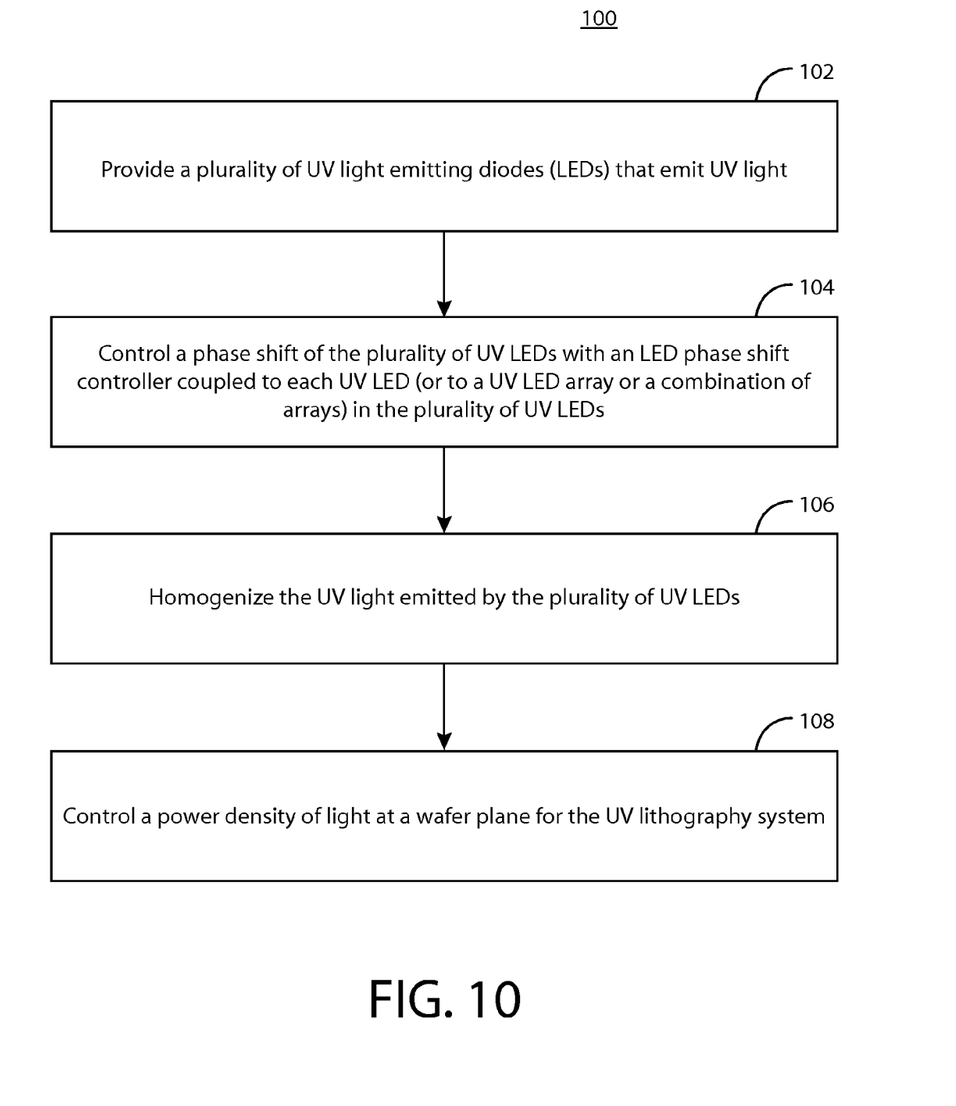
FIG. 10 is a flow chart illustrating a method of in accordance with an embodiment herein.

Referring to FIG. 10, a flow chart illustrates a method 100 of providing a controlled light source for photo lithography system. The method includes any combination of devices and parts discussed above. The parts would be selected in any combination to meet the intended requirement of the design, thus the combination should not be predetermined. In an example embodiment, an ultraviolet (UV) lithography system including providing an plurality of UV light emitting diodes (LEDs) that emit UV light at 102 and controlling a phase shift of the plurality of UV LEDs with an LED phase shift controller coupled to each UV LED in the plurality of UV LEDs at 104. The method 100 at 106 can further homogenize the UV light emitted by the plurality of UV LEDs and control a power density of light at a wafer plane for the UV lithography system at 108.

In one embodiment, a light source can include a plurality of ultraviolet (UV) light emitting diodes (LEDs) and an LED phase shift controller coupled to the plurality of UV LEDs adapted to control a phase shift of each UV LED in the plurality of UV LEDs. The plurality of LEDs can form a UV LED array. The LED phase shift controller can adapt to maintain each of the UV LEDs in the plurality of UV LEDs in-phase. The light source can include a homogenizer adapted to control each of the UV LEDs in the plurality of UV LEDs in an X, Y, and Z direction to adjust a tilt and a height of the plurality of UV LEDs relative to an optical path. The light source can also include a programmable power supply coupled to the plurality of the UV LEDs and adapted to control a power density at a wafer plane for a UV lithography system and can be monitored by energy sensor. The light source can also include a light diffuser placed in an optical path between the UV LED array, or a combination of arrays and a Fresnel lens. Optionally, the light source can include a cooling module coupled to the plurality of UV LEDs where the cooling module comprises at least one or more of a purge gas module, a heat sink module and a cooling water system.

In another embodiment, an ultraviolet (UV) lithography system can include a light source including a plurality of UV light emitting diodes (LEDs) and an LED phase shift controller coupled to the plurality of UV LEDs adapted to control a phase shift of each UV LED in the plurality of UV LEDs. The plurality of UV LEDs forms a UV LED array. A light diffuser can be placed in an optical path between the UV LED array, or a combination of arrays and a Fresnel lens. The system can further include a mirror assembly in a light path of the light source, the mirror assembly having a polarization mirror with an interference coating. As explained above, the LED phase shift controller is adapted to maintain each of the UV LEDs in the plurality of UV LEDs in-phase. The system can also include a homogenizer adapted to control each of the UV LEDs in the plurality of UV LEDs in an X, Y, and Z direction to adjust a tilt and a height of the plurality of UV LEDs relative to an optical path. The system can further optionally include a programmable power supply coupled to the plurality of the UV LEDs and adapted to control a power density of light at a wafer plane and a cooling module coupled to the plurality of UV LEDs. The cooling module can include at least one or more of a purge gas module, a heat sink module and a cooling water system. The system can also include a temperature sensor and temperature controller coupled to the plurality of UV LEDs.

In yet another embodiment, a method providing a light source for an ultraviolet (UV) lithography system can include the element of providing an plurality of UV LEDs that emit UV light and the element of controlling a phase shift of the plurality of UV LEDs (or UV LED array or combination of arrays) with an LED phase shift controller coupled to each UV LED in the plurality of UV LEDs. The method optionally includes homogenizing the UV light emitted by the plurality of UV LEDs and controlling a power density of light at a wafer plane for the UV lithography system.

The preceding merely illustrates the principles of the disclosure. It will thus be appreciated that those skilled in the art will be able to devise various arrangements which, although not explicitly described or shown herein, embody the principles of the disclosure and are included within its spirit and scope. Embodiments can include, but are not limited to any light source providing a solid state light source that can control the phase shift of the solid state light source.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "to", "from", "lower," "upper," "horizontal," "vertical," "above," "below," "up," "down," "before", "after", "top" and "bottom" as well as derivatives thereof (e.g., "horizontally,", "vertically", "downwardly," "upwardly," etc.) should be construed to refer to the orientation as then described or as shown in the drawing under discussion. The drawings are arbitrarily oriented for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

We claim:

1. A light source, comprising:
   a plurality of ultraviolet (UV) light emitting diodes (LEDs), wherein the plurality of UV LEDs comprise a UV LED array or a combination of UV LED arrays;
   an LED phase shift controller coupled to the plurality of UV LEDs adapted to control a phase shift of each UV LED or all UV LEDs in the plurality of UV LEDs; and
   a homogenizer adapted to control the UV LED array or the combination of UV LED arrays in the plurality of UV LEDs in an X, Y, and Z direction to adjust a tilt and a height of the plurality of UV LEDs relative to an optical path.

2. The light source of claim 1, wherein the LED phase shift controller is adapted to maintain each of the UV LEDs in the plurality of UV LEDs in-phase.

3. The light source of claim 1, wherein each UV LED in the plurality of UV LEDs travels individually along an axis parallel to an intended light path providing a level of control of light characteristics at an aperture.

4. The light source of claim 1, comprising a light diffuser or the homogenizer placed in the optical path between the UV LED array or the combination of UV LED arrays and a Fresnel lens or convex lenses.

5. The light source of claim 1, further comprising a programmable power supply coupled to the plurality of the UV LEDs and adapted to control a power density at a wafer plane for a UV lithography system and monitored by an energy sensor.

6. The light source of claim 1, further comprising a cooling module coupled to the plurality of UV LEDs.

7. The light source of claim 6, wherein the cooling module comprises at least one or more of a purge gas module, a heat sink module, or a cooling water system.

8. An ultraviolet (UV) lithography system, comprising:
   a light source, comprising:
      a plurality of UV light emitting diodes (LEDs); and
      an LED phase shift controller coupled to the plurality of UV LEDs adapted to control a phase shift of each UV LED in the plurality of UV LEDs;
   a mirror assembly in a light path of the light source, the mirror assembly having a polarization mirror with an interference coating.

9. The UV lithography system of claim 8, wherein the LED phase shift controller is adapted to maintain each of the UV LEDs or arrays of the UV LEDs in the plurality of UV LEDs in-phase.

10. The UV lithography system of claim 8, further comprising a controller adapted to control the UV LEDs array or a combination of UV LED arrays or each of the UV LEDs in the plurality of UV LEDs in an X, Y, and Z direction to adjust a tilt and a height of the plurality of UV LEDs relative to an optical path.

11. The UV lithography system of claim 8, further comprising a programmable power supply coupled to the plurality of the UV LEDs and adapted to control a power density of light at a wafer plane.

12. The UV lithography system of claim 8, wherein the plurality of UV LEDs form a UV LED array or a combination of UV LED arrays.

13. The UV lithography system of claim 12, further comprising a light diffuser placed in an optical path between the UV LED array and a Fresnel lens.

14. The UV lithography system of claim 8, further comprising a cooling module coupled to the plurality of UV LEDs.

15. The UV lithography system of claim 14, wherein the cooling module comprises at least one or more of a purge gas module, a heat sink module, or a cooling water system.

16. The UV lithography system of claim 8, further comprising a temperature sensor and a temperature controller coupled to the plurality of UV LEDs.

17. A method providing a light source for an ultraviolet (UV) lithography system, comprising:
   providing an plurality of UV light emitting diodes (LEDs) that emit UV light, wherein the plurality of UV LEDs comprise a UV LED array or a combination of UV LED arrays; and
   controlling a phase shift of the plurality of UV LEDs with an LED phase shift controller coupled to each UV LED, or coupled to a UV LED array or coupled to a combination of UV LED arrays in the plurality of UV LEDs;
   controlling the UV LED array or the combination of UV LED arrays in the plurality of UV LEDs in an X, Y, and Z direction to adjust a tilt and a height of the plurality of UV LEDs relative to an optical path.

18. The method of claim 17, further comprising homogenizing the UV light emitted by the plurality of UV LEDs.

19. The method of claim 17, further comprising controlling a power density of light at a wafer plane for the UV lithography system.

20. The method of claim 17, further comprising providing a mirror assembly in a light path of the light source, the mirror assembly having a polarization mirror with an interference coating.

* * * * *